(12) United States Patent
Kim

(10) Patent No.: US 7,864,537 B2
(45) Date of Patent: Jan. 4, 2011

(54) SOCKET FOR TESTING MAIN BOARD HAVING WATER-COOLED COOLER FIXING STRUCTURE

(76) Inventor: Tae Wan Kim, 329-2, Banwall-dong, Hwasung-si, Gyounggi-do (KR)

( * ) Notice: Subject to any disclaimer, the term of this patent is extended or adjusted under 35 U.S.C. 154(b) by 0 days.

(21) Appl. No.: 12/481,053

(22) Filed: Jun. 9, 2009

(65) Prior Publication Data
US 2009/0311894 A1  Dec. 17, 2009

(30) Foreign Application Priority Data
Jun. 17, 2008  (KR) ...................... 10-2008-0056968

(51) Int. Cl.
  *H05K 7/20* (2006.01)
(52) U.S. Cl. ...................... 361/719; 361/704; 165/80.3; 257/718; 257/719
(58) Field of Classification Search ........................ None
  See application file for complete search history.

(56) References Cited

U.S. PATENT DOCUMENTS

| | | | | |
|---|---|---|---|---|
| 5,640,303 | A * | 6/1997 | Hooley | 361/699 |
| 6,198,630 | B1 * | 3/2001 | Cromwell | 361/704 |
| 6,785,136 | B2 * | 8/2004 | Chang et al. | 361/704 |
| 7,106,594 | B2 * | 9/2006 | Vetter et al. | 361/719 |
| 7,286,362 | B2 * | 10/2007 | Yu et al. | 361/704 |
| 7,336,492 | B2 * | 2/2008 | Yu | 361/710 |
| 7,430,121 | B2 * | 9/2008 | Lu et al. | 361/719 |
| 7,480,144 | B2 * | 1/2009 | Li | 361/704 |
| 7,499,279 | B2 * | 3/2009 | Campbell et al. | 361/702 |
| 7,551,447 | B2 * | 6/2009 | Li et al. | 361/719 |
| 7,697,295 | B2 * | 4/2010 | Kuo et al. | 361/709 |

* cited by examiner

*Primary Examiner*—Boris L Chervinsky
(74) *Attorney, Agent, or Firm*—Sherr & Vaughn, PLLC

(57) ABSTRACT

Provided is a socket for testing a main board having a water-cooled cooler fixing structure that fixes a water-cooled cooler to the top surface of a central processing unit (CPU) mounted to a main board for a computer during testing of the fraction defective of the main board. The socket for testing a main board includes a socket body having a size larger than a CPU mounted on a main board and having a cooler positioning recess of a predetermined size into which a water-cooled cooler is inserted to be positioned therein, the socket body being installed over the CPU mounted on the main board, a cooler fixing unit installed across an upper portion of the cooler positioning recess of the socket body, and having one end pivotally coupled to a top end of the socket body using a hinge to fix the water-cooled cooler inserted into and positioned in the cooler positioning recess, a cooler pressing unit, a bottom surface of which is attached to a top surface of the CPU mounted on the main board by resiliently pressing a top surface of the water-cooled cooler positioned in the cooler positioning recess of the socket body through fixation of the cooler fixing unit, and a socket fixing unit fixing the socket body onto the main board.

6 Claims, 8 Drawing Sheets

SOCKET FOR TESTING MAIN BOARD HAVING WATER-COOLED COOLER FIXING STRUCTURE

CROSS REFERENCE TO RELATED APPLICATIONS

This application claims priority under 35 U.S.C §119 to Korean Patent Application No. 10-2008-0056968, filed on Jun. 17, 2008, in the Korean Intellectual Property Office, the entire contents of which are herein incorporated by reference.

BACKGROUND

1. Field of the Invention

The present invention relates to a socket for testing a main board having a water-cooled cooler fixing structure. More specifically, the present invention relates to a socket for testing a main board having a water-cooled cooler fixing structure that fixes a water-cooled cooler to the top surface of a central processing unit (CPU) mounted on a main board for a computer during testing of the fraction defective of the main board.

2. Discussion of Related Art

In general, a computer refers to a device that processes information using programs. The first computer was MARK-1 manufactured at Harvard University in 1944 using a relay. Later, an electronic numerical integrator and computer (ENIAC) was manufactured at Pennsylvania University around 1945 but did not secure a wide range of use due to its processing of programs by wire logics.

A vacuum tube was used in the beginning stages of computers and was converted to a semiconductor device, i.e. a transistor around 1957. From around 1965, applications of a computer were extended to the fields of industry, business, education, and defense due to rapid development of semiconductor design technology including integrated circuits. Development of a general-purpose computer has been led by the US firm IBM since the 1960s.

Computer systems may be classified as a general-purpose computer, a special-purpose computer, or an artificial intelligence computer. Technology using computers is crucial to development of national industries and scientific technology and is becoming an important means for creating additional value in countries where natural resources are poor.

Meanwhile, the performance of a personal computer is remarkably developing due to development of a central processing unit (CPU). In 1992, graphics-based software called Windows entered the stage to replace the prior text-based software and triggered rapid distribution of Windows compatible products. Meanwhile, laptop computers are being miniaturized, and performance and colors thereof are being rapidly improved. Competition to develop quicker and more excellent computers, development of super computers, parallel processing computers, and reduced instruction set computers (RISCs), and efforts to enhance the performances of computers are continuously being made.

As described above, focus on development of CPUs and memory chips allowing for high-speed processing of more data is accelerating the competition to develop quicker and more excellent computers. The CPUs developed through such technological development generate much heat in a process of processing numerous data at high speeds. Therefore, coolers are installed in CPUs mounted on main boards to dissipate heat and secure safety from processing of data.

Coolers installed on the top surfaces of CPUs to secure safety from processing of data by dissipating heat generated by the CPUs are classified into air-cooled coolers that cool CPUs through flow of air generated when a cooling fan is rotated and water-cooled coolers that cool CPUs through flow of a refrigerant. Here, air-cooled coolers are inexpensive but have a large volume, while water-cooled coolers have a small volume and an excellent cooling efficiency but are complex and expensive. Therefore, air-cooled coolers are installed in almost all personal computers.

Meanwhile, when the fraction defective of a main board to which a CPU of a finished computer is mounted is tested, a large-volume air-cooled cooler is installed in the CPU of the main board separated from the computer, causing various inconveniences. Moreover, when the fraction defective of a main board to which a CPU is mounted is tested by fixing the main board through a fixing socket for a test, the fixing socket for fixing the main board needs to have a large volume due to a large volume air-cooled cooler. Therefore, when the fraction defective of a main board is tested, an air-cooled cooler installed in a CPU is removed and a water-cooled cooler is mounted.

However, since an existing fixing socket for testing a main board for a computer does not have a separate fixing structure for installing a water-cooled cooler on the top surface of a CPU, heat transferring grease is coated on the top surface of the CPU to fix the water-cooled cooler through a clip when the fraction defective of the main board is tested. Therefore, since a water-cooled cooler is fixed to the top surface of a CPU without using a separate fixing socket, there is a difficulty in testing a main board.

SUMMARY OF THE INVENTION

The present invention is directed to a socket for testing a main board having a water-cooled cooler fixing structure that enables easy testing of the fraction defective of a main board by using a fixing socket for a test for easily attaching a water-cooled cooler to the top surface of a CPU, and a water-cooled cooler attached to the top surface of the CPU through the fixing socket when the fraction defective of the main board for a computer is tested.

The present invention is also directed to a socket for testing a main board having a water-cooled cooler fixing structure that enables smooth testing of the fraction defective of a main board by easily attaching a water-cooled cooler to the top surface of a CPU in a form in which the main board is fixed by the socket or the socket is fixed to the main board.

The present invention is also directed to a socket for testing a main board having a water-cooled cooler fixing structure that allows for an excellent attaching force between a CPU and a water-cooled cooler by resiliently attaching the water-cooled cooler to the top surface of the CPU in a form in which the main board is fixed by the socket or the socket is fixed to the main board, and enhances the accuracy of the test by efficiently cooling heat generated by the CPU.

One aspect of the present invention provides a socket for testing a main board having a water-cooled cooler fixing structure, including: a socket body having a size larger than a CPU mounted on a main board and having a cooler positioning recess of a predetermined size into which a water-cooled cooler is inserted to be positioned therein, the socket body being installed over the CPU mounted on the main board; a cooler fixing unit installed across an upper portion of the cooler positioning recess of the socket body, and having one end pivotally coupled to a top end of the socket body using a hinge to fix the water-cooled cooler inserted into and positioned in the cooler positioning recess; a cooler pressing unit, a bottom surface of which is attached to a top surface of the CPU mounted on the main board by resiliently pressing a top surface of the water-cooled cooler positioned in the cooler positioning recess of the socket body through fixation of the cooler fixing unit; and a socket fixing unit fixing the socket body onto the main board.

The cooler fixing unit may include: a cooler fixing member pivotally coupled to a top end of the socket body using a hinge and crossing an upper portion of the cooler positioning recess; a hook member pivotally installed at one end of the cooler fixing member and having a catching hook at a lower end thereof; a catching step formed on the outer surface of the socket body and corresponding to the catching hook of the hook member; and a resilient spring installed at one end of the cooler fixing member to constantly apply a force in a direction in which the hook member is caught by the catching step.

The hinge may be inserted into a lengthwise hinge insertion hole having a predetermined depth and formed on a lower surface of the socket body to hinge one end of the cooler fixing member to the socket body and may be fixed onto the hinge insertion hole by a screw head of a hinge fixing screw screw-coupled upward through the hinge insertion hole.

The cooler pressing unit may include: a positioning recess having a predetermined width and formed on a lower surface of the cooler fixing member, the positioning recess having hinge holes formed through both sides thereof on the same line; a cooler pressing piece having a size corresponding to the positioning recess and protruding in the positioning recess, in which hinge through-holes are formed to correspond to the hinge holes so that the cooler pressing piece is moved upward and downward; a hinge passing through the hinge holes and the hinge through-holes to install the cooler pressing piece in the positioning recess; and a pressing spring installed in the positioning recess to constantly press the cooler pressing piece outward.

A position fixing recess corresponding to the cooler pressing piece of the cooler pressing unit may be formed at a central portion of a top surface of the water-cooled cooler to fix the position of the water-cooled cooler by the cooler pressing piece when the water-cooled cooler is fixed to the cooler positioning recess through the cooler fixing unit.

The socket fixing unit may include: a plurality of screw coupling holes formed on a bottom surface of the socket body; and a plurality of fixing bolts passing through a bottom surface of the main board to fix the socket body to the main board by coupling to the screw coupling holes.

A tip end surface of the socket body formed on a tip end of the cooler positioning recess may be opened such that a coupling formed at a tip end surface of the water-cooled cooler is inserted and positioned.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

Hereinafter, a socket for testing a main board having a water-cooled cooler fixing structure according to exemplary embodiments of the present invention will be described in detail with reference to the accompanying drawings.

Figure 1:
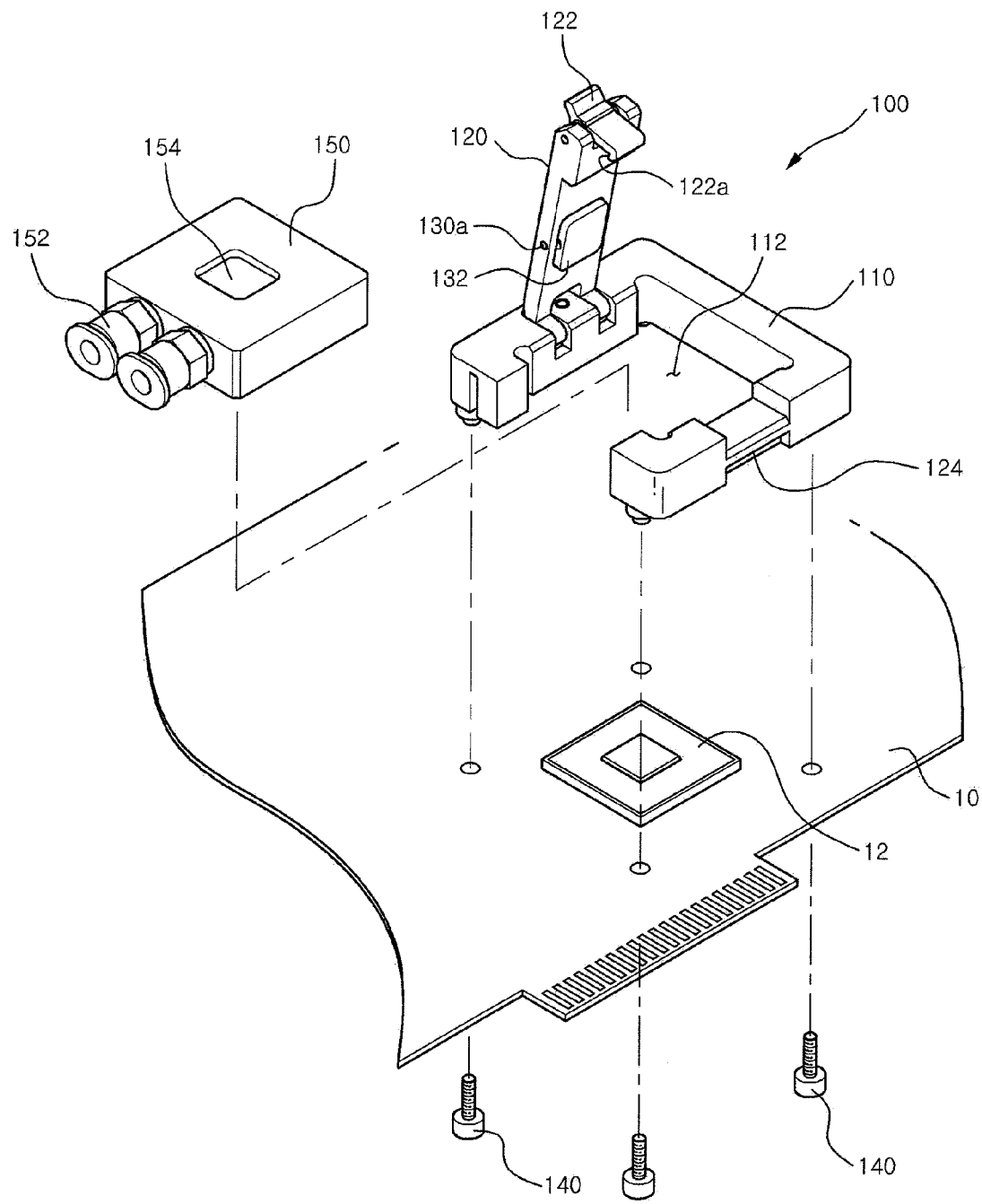
FIG. 1 is a perspective view of a socket for testing a main board having a water-cooled cooler fixing structure from which a water-cooled cooler is separated according to an exemplary embodiment of the present invention.
Figure 2:
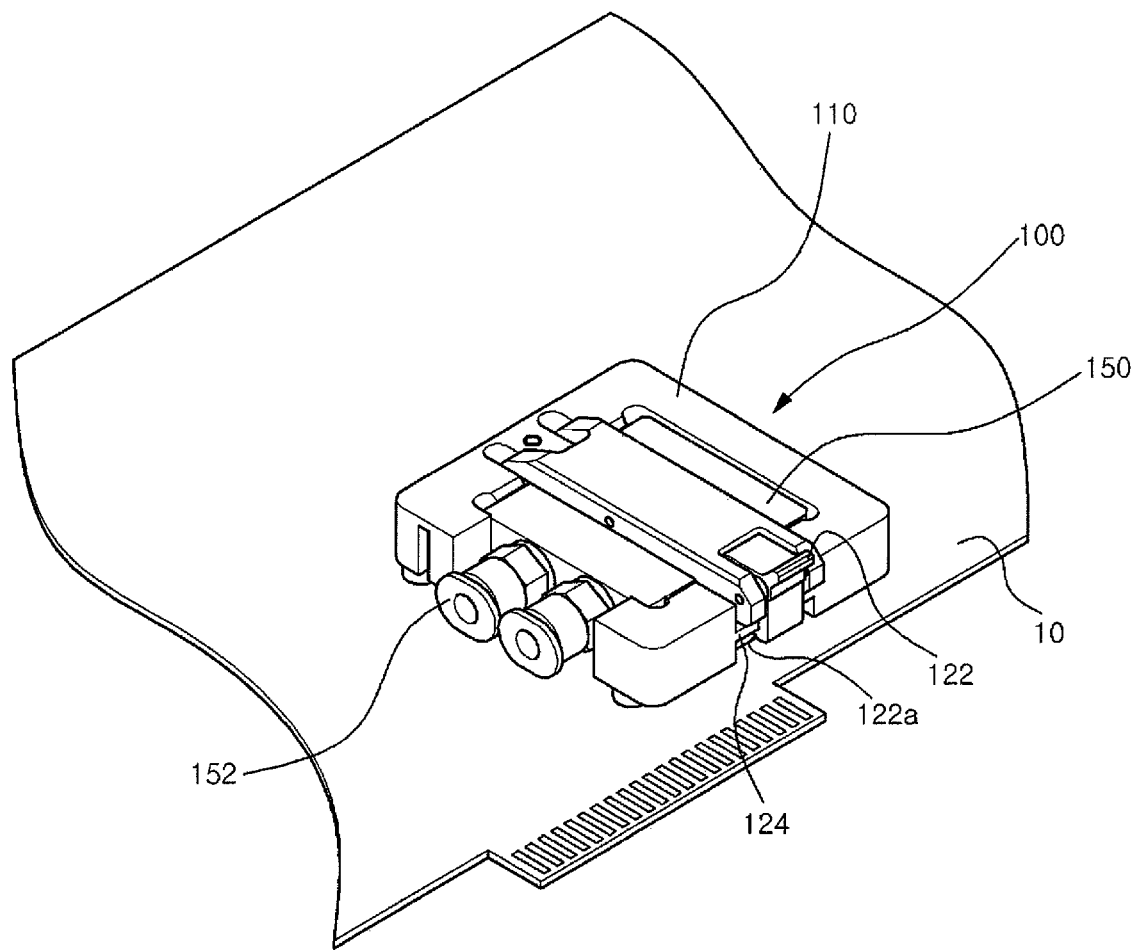
FIG. 2 is a perspective view of the socket for testing a main board having a water-cooled cooler fixing structure in which the water-cooled cooler is installed according to the exemplary embodiment of the present invention.
Figure 3:
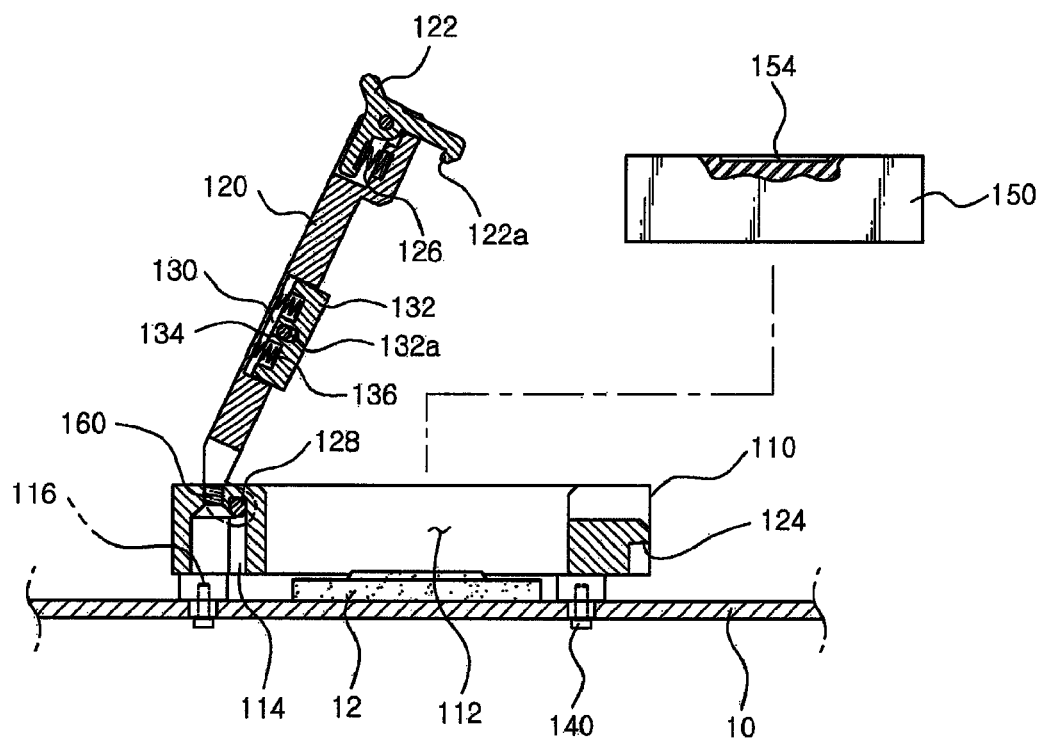
FIG. 3 is a cross-sectional view of the socket for testing a main board having a water-cooled cooler fixing structure from which the water-cooled cooler is separated according to the exemplary embodiment of the present invention.
Figure 4:
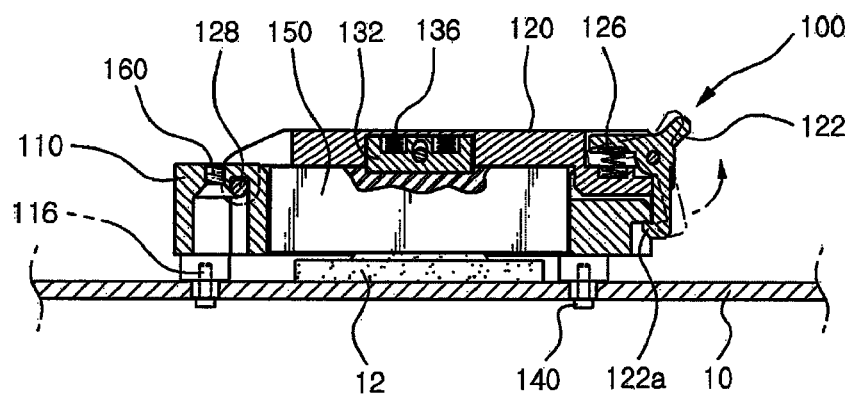
FIG. 4 is a cross-sectional view of the socket for testing a main board having a water-cooled cooler fixing structure in which the water-cooled cooler is installed according to the exemplary embodiment of the present invention.

FIG. 1 is a perspective view of a socket for testing a main board having a water-cooled cooler fixing structure from which a water-cooled cooler is separated according to an exemplary embodiment of the present invention. FIG. 2 is a perspective view of the socket for testing a main board having a water-cooled cooler fixing structure in which the water-cooled cooler is installed according to the exemplary embodiment of the present invention. FIG. 3 is a cross-sectional view of the socket for testing a main board having a water-cooled cooler fixing structure from which the water-cooled cooler is separated according to the exemplary embodiment of the present invention. FIG. 4 is a cross-sectional view of the socket for testing a main board having a water-cooled cooler fixing structure in which the water-cooled cooler is installed according to the exemplary embodiment of the present invention.

As illustrated in FIGS. 1 to 4, a socket 100 for testing a main board according to an exemplary embodiment of the present invention includes a socket body 110 having a cooler positioning recess 112, a cooler fixing unit fixing the water-cooled cooler 150 inserted into and positioned in the cooler positioning recess 112, a cooler pressing unit resiliently pressing the water-cooled cooler 150 inserted into and positioned in the cooler positioning recess 112 toward the top surface of a CPU 12 mounted on the main board 10, and a socket fixing unit fixing the socket body 110 onto the main board 10. Here, the main board 10 is randomly selected and an air-cooled cooler originally installed on the CPU 12 is removed.

The above-described socket 100 for testing a main board according to the exemplary embodiment of the present invention is fixed to the water-cooled cooler 150 on the CPU 12 through the cooler fixing unit after the water-cooled cooler 150 is inserted into the cooler positioning recess 112 of the socket body 110 and positioned on the CPU 12 with the socket body 110 being fixed onto the CPU 12 mounted on the main board 10 through the socket fixing unit. Then, in the process of fixing the water-cooled cooler 150 on the CPU 12 through the cooler fixing unit, the cooler pressing unit presses the water-cooled cooler 150 on the cooler positioning recess 112 toward the top surface of the CPU 12.

Meanwhile, as described above, after the fraction defective of the main board 10 is tested by fixing the water-cooled cooler 150 though the socket 100 for testing the main board onto the CPU 12, only when the fixed state of the cooler fixing unit is released, can the water-cooled cooler 150 be separated from the cooler positioning recess 112 of the socket body 110. Hereinafter, the socket for testing a main board having a water-cooled cooler fixing structure according to the exemplary embodiment of the present invention will be described in further detail.

In the socket for testing a main board having a water-cooled cooler fixing structure according to the exemplary embodiment of the present invention, the socket body 110 is adapted to fix the water-cooled cooler 150. As illustrated in FIGS. 1 to 4, the cooler positioning recess 112 is formed in a plate member, i.e. the socket body 110 in a configuration corresponding to the water-cooled cooler 150.

As described above, the cooler positioning recess 112 of the socket body 110 has a size larger than that of the CPU 12 mounted on the main board 10. As illustrated in FIGS. 1, 3, and 4, the socket body 110 is installed on the main board 10. That is, the socket body 110 is installed on the CPU 12 mounted on the main board 10 so that the CPU 12 mounted on the main board 10 is located on the cooler positioning recess 112 of the socket body 110.

Meanwhile, a tip end portion of the socket body 110 forming the tip end of the cooler positioning recess 112 is opened so that a coupling 152 formed on the tip end surface of the water-cooled cooler 150 can be inserted into and positioned in it. That is, when the water-cooled cooler 150 is positioned in the cooler positioning recess 112 of the socket body 110, a tip end portion of the socket body 110 is opened so that the coupling 152 formed on the tip end surface of the water-cooled cooler cannot be caught by the tip end of the socket body 110.

In other words, since the water-cooled cooler 150 according to the exemplary embodiment of the present invention has a configuration corresponding to the cooler positioning recess 112 of the socket body 110 and hoses (not shown) for a refrigerant supplied and circulated through a refrigerant purifying unit (not shown) are connected to the water-cooled cooler 150 through the coupling 152, the tip end portion of the socket body 110 is opened so that the coupling 152 cannot be caught by the tip end of the socket body 110 when the water-cooled cooler 150 is positioned in the cooler positioning recess 112 of the socket body 110.

In the socket 100 for testing a main board according to the exemplary embodiment of the present invention, the cooler fixing unit is adapted to fix the water-cooled cooler 150 positioned on the top surface of the CPU 12 through the cooler positioning recess 112 of the socket body 110. As illustrated in FIGS. 1 to 4, the cooler fixing unit is installed across an upper portion of the cooler positioning recess 112 of the socket body 110, and one end of the cooler fixing unit is pivotally coupled to the top end of the socket body 110 by a hinge mechanism to fix the water-cooled cooler inserted into and positioned in the cooler positioning recess 112.

The above-described cooler fixing unit includes a cooler fixing member 120 pivotally coupled to a top end of the socket body 110 by a hinge 128 to cross an upper portion of the cooler positioning recess 112, a hook member 122 pivotally mounted to the free end of the cooler fixing member 120 and having a catching hook 122a at its lower end, a catching step 124 formed on the outer surface of one end of the socket body 110 and corresponding to the catching hook 122a of the hook member 122, and a resilient spring 126 installed at the free end of the cooler fixing member 120 to constantly apply a force in a direction in which the hook member 122 can be caught by the catching step 124.

In the above-described cooler fixing unit, if the cooler fixing member 120 is rotated downward toward one end of the socket body 100 with the water-cooled cooler 150 being inserted into and positioned in the cooler positioning recess 112 of the socket body 110, the catching hook 122a of the hook member 122 is caught by the catching step 124 formed on the outer surface of the socket body 110 to fix the water-cooled cooler 150 inserted into and positioned in the cooler positioning recess 112 of the socket body 110.

Meanwhile, in the above-described cooler fixing unit, the hinge 128 is inserted through a hinge insertion hole 114 having a predetermined depth and formed on the bottom surface of one side of the socket body 110 to hinge one end of the cooler fixing member 120 to the socket body 110 and is fixed to the hinge insertion hole 114 by a screw head of a hinge fixing screw 160 screw-coupled to the socket body 110 upward.

In other words, the hinge 128 pivoting the cooler fixing member 120 is inserted through the hinge insertion hole 114 having a predetermined depth and formed on the bottom surface of one side of the socket body 110 to be coupled to a hinge hole at one end of the cooler fixing member 120 inserted into the hinge insertion hole 114, allowing the cooler fixing member 120 to be pivoted. Then, the hinge 128 coupled to the hinge hole at one end of the cooler fixing member 120 is fixed to the hinge insertion hole 114 using a screw head of the hinge fixing screw 160 screw-coupled to the socket body 110 upward through the hinge insertion hole 114 formed on the bottom surface of the socket body 110.

In the socket 100 for testing a main board according to the exemplary embodiment of the present invention, the cooler pressing unit is adapted to attach the water-cooled cooler 150 to the CPU 12 more appropriately by resiliently pressing the water-cooled cooler 150 positioned on the top surface of the CPU 12 through the cooler positioning recess 112 of the socket body 110. As illustrated in FIGS. 1 to 4, the cooler pressing unit attaches the water-cooled cooler 150 to the top surface of the CPU 12 mounted on the main board 10 by resiliently pressing the top surface of the water-cooled cooler 150 positioned in the cooler positioning recess 112 of the socket body 110 by fixation of the cooler fixing unit.

The above-described cooler pressing unit includes a positioning recess 130 formed on the bottom surface of the cooler fixing member 120 by a predetermined depth and having hinge holes 130a formed on the same line at both sides of the positioning recess 120, a cooler pressing piece 132 having a size corresponding to the positioning recess 130, protruding on the positioning recess 130 and having a hinge through-hole 132a corresponding to the hinge holes 130a so that the cooler pressing piece 132 can be moved within a predetermined range, a hinge 134 coupled to the hinge hole 130a through the hinge through-hole 132a such that the cooler pressing piece 132 is installed in the positioning recess 130, and pressing springs 136 installed in the positioning recess 130 to constantly press the cooler pressing piece 132 outward.

Meanwhile, if the cooler fixing member 120 of the cooler fixing unit is fixed to the socket body 110 with the water-cooled cooler 150 being inserted into and positioned in the cooler positioning recess 112 of the socket body 110, the above-described cooler pressing unit attaches the water-cooled cooler 150 to the CPU 12 by allowing the cooler pressing piece 132 to press the water-cooled cooler 150 inserted into and positioned in the cooler positioning recess 112 of the socket body 110 toward the top surface of the CPU 12 mounted on the main board 10.

As described above, in the process of pressing the water-cooled cooler 150 inserted into and positioned in the cooler positioning recess 112 by fixing the cooler fixing member 120 of the cooler fixing unit to the water-cooled cooler 150, the cooler pressing piece 132 is pressed upward by the water-cooled cooler 150 and the cooler fixing member 120 due to the longitudinal hinge through hole 132a and the pressing springs 136. Therefore, the water-cooled cooler 150 is pressed by a predetermined force through the cooler pressing unit to be attached to the CPU 12.

As described above, a position fixing recess 154 is formed at a central portion of the top surface of the water-cooled cooler 150 pressed and attached to the top surface of the CPU 12 at a location corresponding to the cooler pressing piece 132 of the cooler pressing unit through the cooler pressing unit. When the cooler pressing piece 132 is positioned in the position fixing recess 154 on the top of the water-cooled cooler 150, the water-cooled cooler 150 is fixed to the cooler positioning recess 112 through the cooler fixing unit and movement of the water-cooled cooler 150 forward, backward, right and left is restrained.

In the socket 100 for testing a main board according to the exemplary embodiment of the present invention, the socket fixing unit is adapted to fix the socket body 110 to the top surface of the CPU 12 mounted on the main board 10. As illustrated in FIGS. 1 to 4, the socket fixing unit includes a plurality of screw coupling holes formed on the bottom surface of the socket body 110 and a fixing bolt 140 passing through the bottom surface of the main board 10 to fix the socket body 110 to the top of the CPU 12 mounted on the main board 10 by coupling to the screw coupling hole 116.

As described above, FIGS. 1 to 4 illustrate the socket for testing a main board that fixes the socket body 110 to the top of the CPU 12 of the main board 10, and the socket body 110 has a small size to be fixed to the top of the CPU 12 of the main board 10. Hereinafter, a socket for testing a main board according to another exemplary embodiment of the present invention will be described in detail.

Figure 5:
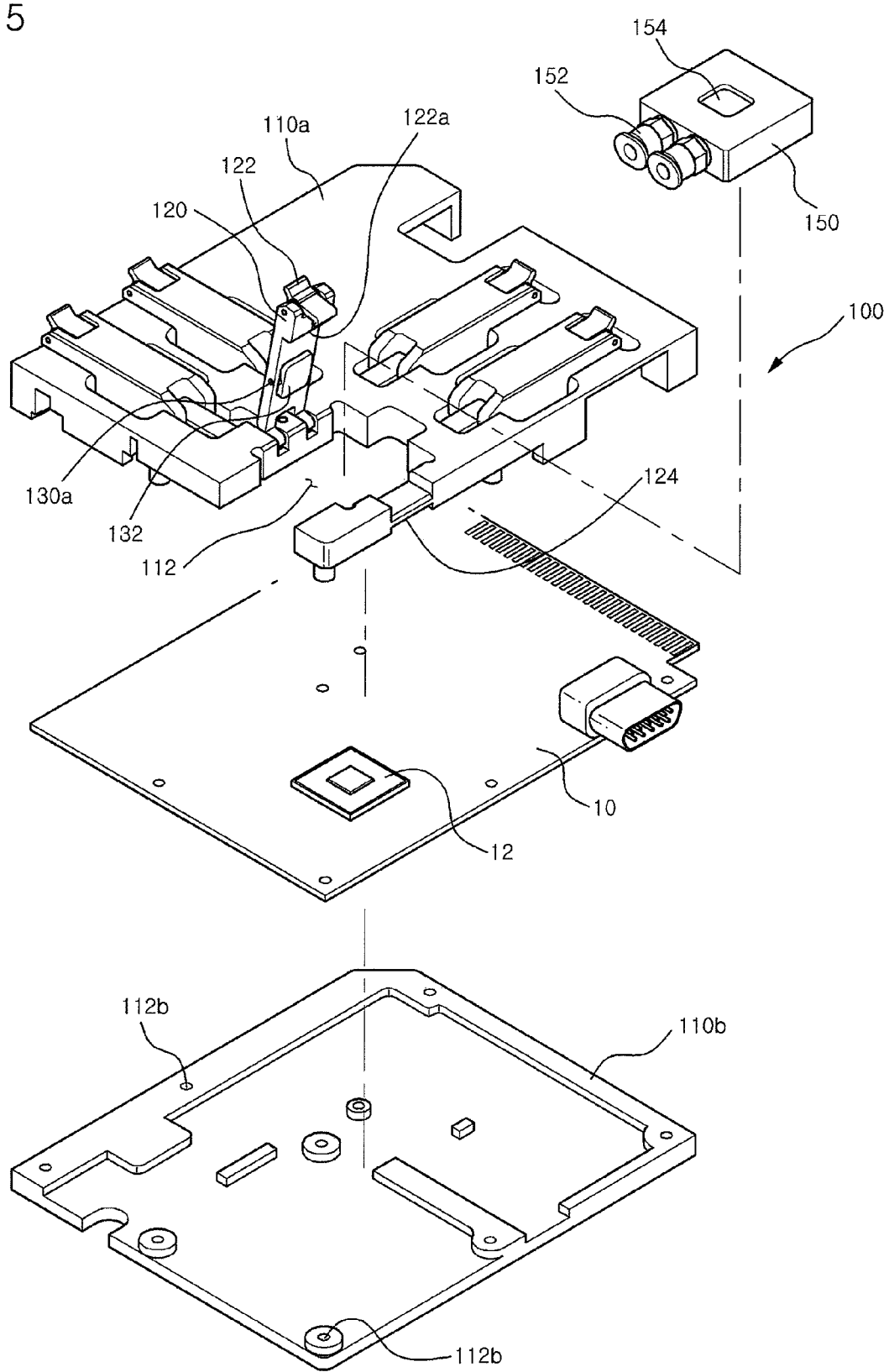
FIG. 5 is an exploded perspective view of a socket for testing a main board having a water-cooled cooler fixing structure according to another exemplary embodiment of the present invention.
Figure 6:
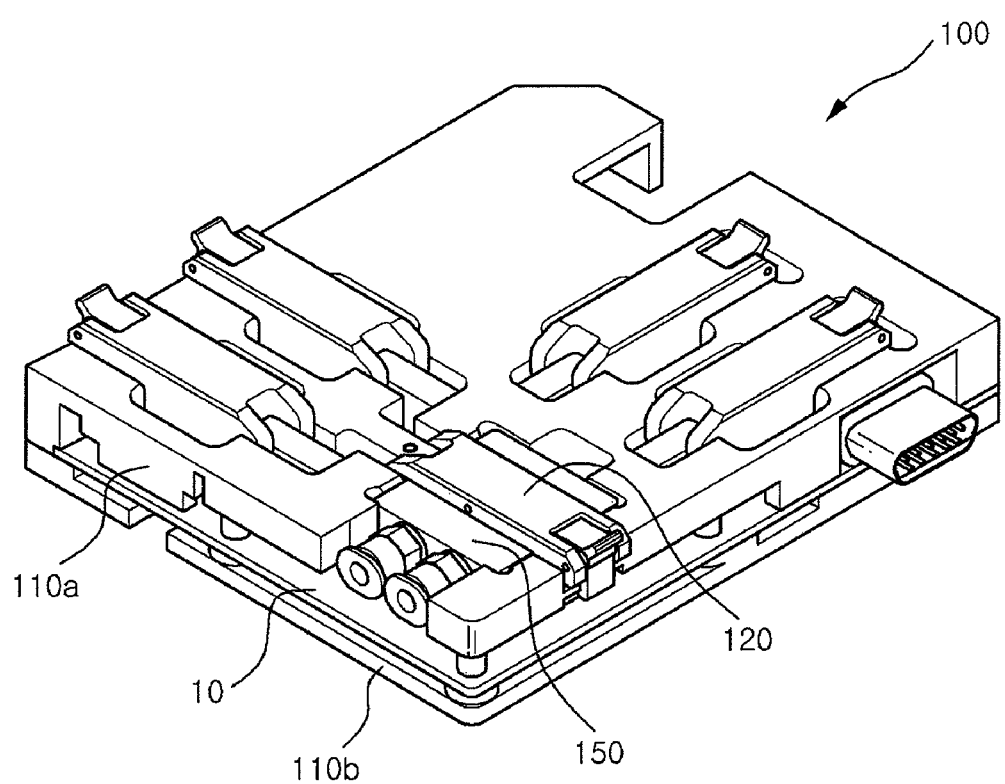
FIG. 6 is a perspective view of the socket for testing a main board having a water-cooled cooler fixing structure according to another exemplary embodiment of the present invention.
Figure 7:
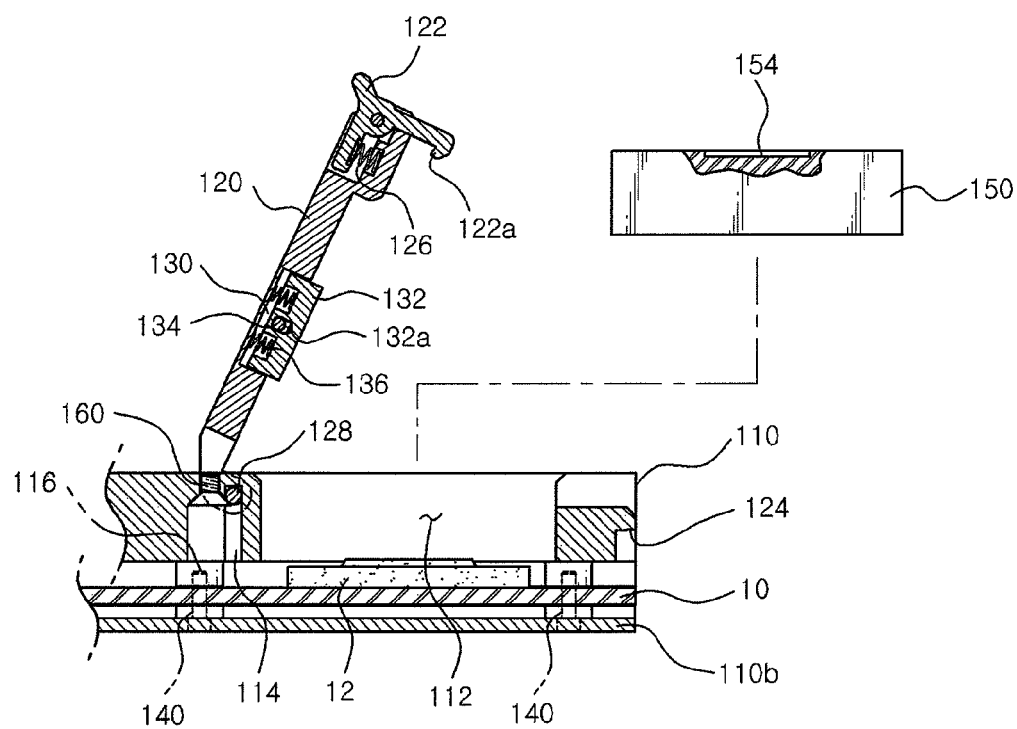
FIG. 7 is a cross-sectional view of a water-cooled cooler before being fixed through the socket for testing a main board according to another exemplary embodiment of the present invention.
Figure 8:
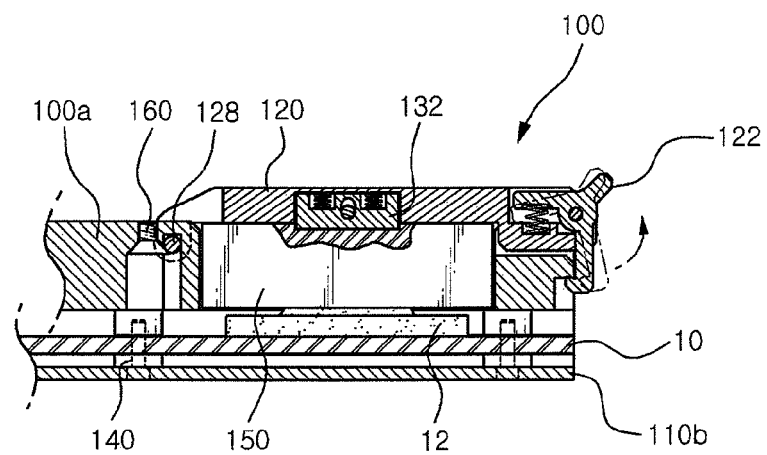
FIG. 8 is a cross-sectional view of a water-cooled cooler after being fixed through the socket for testing a main board according to another exemplary embodiment of the present invention.

FIG. 5 is an exploded perspective view of a socket for testing a main board having a water-cooled cooler fixing structure according to another exemplary embodiment of the present invention. FIG. 6 is a perspective view of the socket for testing a main board having a water-cooled cooler fixing structure according to another exemplary embodiment of the present invention. FIG. 7 is a cross-sectional view of a water-cooled cooler before being fixed through the socket for testing a main board according to another exemplary embodiment of the present invention. FIG. 8 is a cross-sectional view of a water-cooled cooler after being fixed through the socket for testing a main board according to another exemplary embodiment of the present invention.

A socket 100 for testing a main board illustrated in FIGS. 5 to 8 has a large size not to be fixed to a main board but to fix a main board therebetween. Since the sole difference between the socket 100 for testing a main board illustrated in FIGS. 5 to 8 and the socket 100 for testing a main board illustrated in FIGS. 1 to 4 is a socket body 110, and the other structures are the same, the same reference numerals used in FIGS. 1 to 4 are used in FIGS. 5 to 8.

Meanwhile, in the socket 100 for testing a main board according to the exemplary embodiment of the present invention as illustrated in FIGS. 5 to 8, the socket body 110 has an upper socket body 110a and a lower socket body 110b. The main board 10 is fixed between the socket body 110 having the upper socket body 110a and the lower socket body 110b by passing a fixing bolt 140 to be described below through the lower socket body 110b and the main board 10 with the main board 10 being inserted between the upper socket body 110a and the lower socket body 110b, and coupling the fixing bolt 140 to a screw coupling hole 116 formed on the bottom surface of the upper socket body 110a.

As described above, a cooler positioning recess 112 having an opened side is formed in the upper socket body 110a located on the CPU 12 of the main board 10. This cooler positioning recess 112 carries out the same function as the cooler positioning recess 112 of FIGS. 1 to 4. Therefore, a description of the cooler positioning recess 112 will not be repeated.

Like the socket 100 for testing a main board illustrated in FIGS. 1 to 4, the socket for testing a main board illustrated in FIGS. 5 to 8 includes a cooler fixing unit fixing a water-cooled cooler 150 inserted into and positioned in a cooler positioning recess 112 and a cooler pressing unit pressing the water-cooled cooler 150 fixed to the cooler positioning recess 112 to attach the water-cooled cooler 150 to the top surface of the CPU 12.

As described above, the cooler fixing unit and the cooler pressing unit of FIGS. 5 to 8 have the same structures and functions as those of the cooler fixing unit and the cooler pressing unit of FIGS. 1 to 4. Therefore, the structures of the cooler fixing unit and the cooler pressing unit of FIGS. 5 to 8 will be omitted.

In the socket 100 for testing a main board according to the exemplary embodiment of the present invention illustrated in FIGS. 5 to 8, the socket fixing unit includes a plurality of screw coupling holes 116 formed on the bottom surface of the upper socket body 110a, screw through-holes 112b formed in the lower socket body 110b and corresponding to the screw coupling holes 116 of the upper socket body 110a, and fixing bolts 140 passing through the main board 10 to be coupled to the screw coupling holes 116 of the upper socket body 110a, thereby fixing the main board 10 between the upper and lower socket bodies 110a and 110b As described above, the socket 100 for testing a main board according to the exemplary embodiment of the present invention illustrated in FIGS. 5 to 8 has the same structure as the socket 100 for testing a main board according to the exemplary embodiment of the present invention illustrated in FIGS. 1 to 4 except for the socket body 110 having two parts to fix the main board 10 therebetween.

Figure 9:
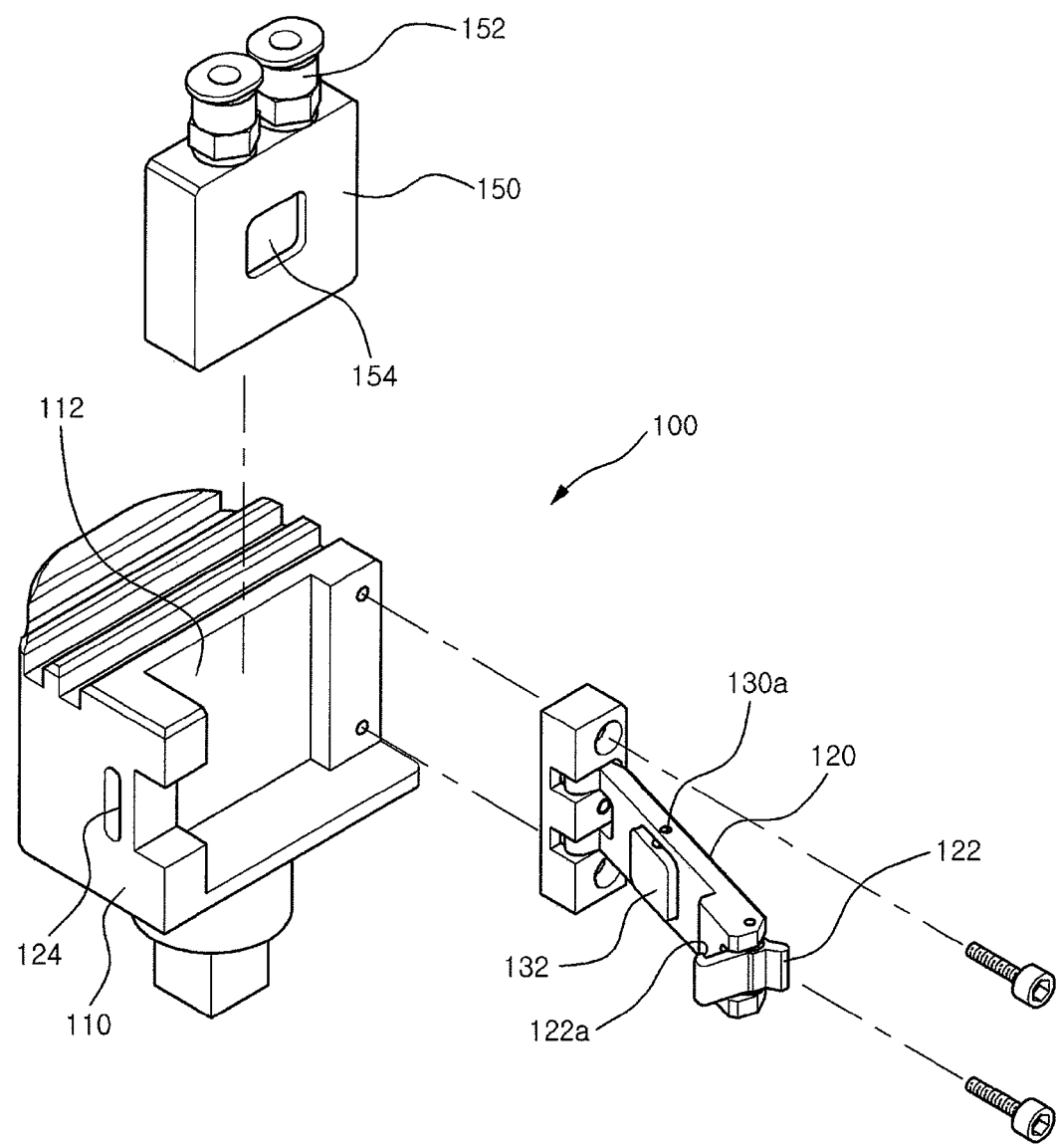
FIG. 9 is an exploded perspective view of a socket for testing a main board having a water-cooled cooler structure according to still another exemplary embodiment of the present invention.
Figure 10:
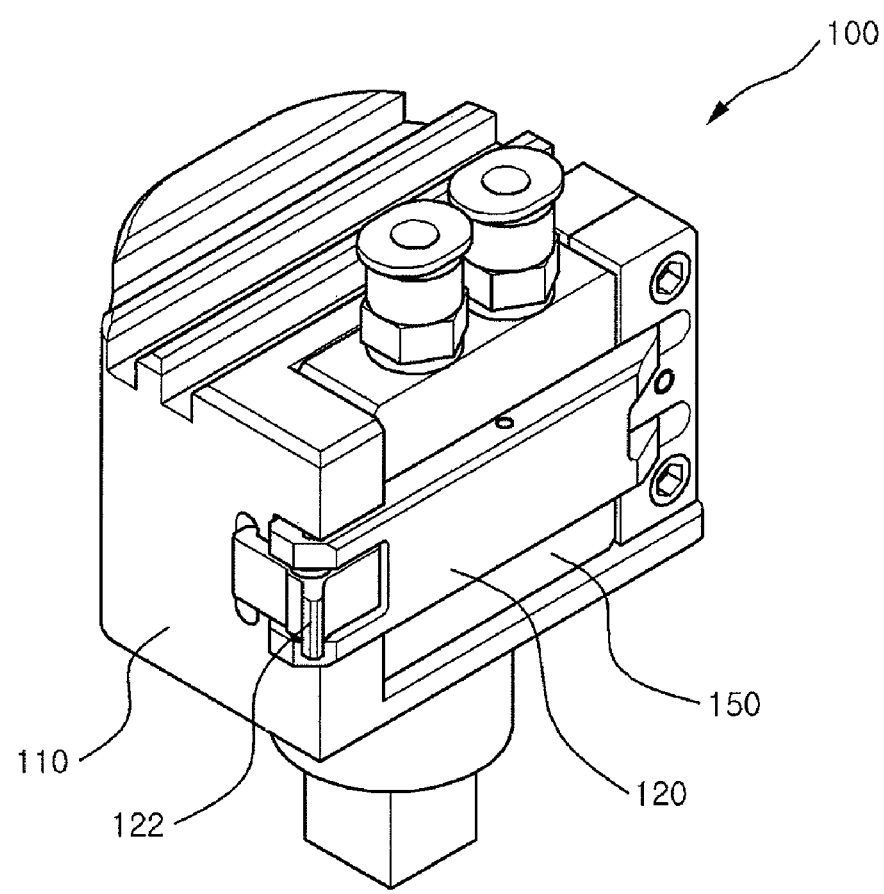
FIG. 10 is a perspective view of the socket for testing a main board having a water-cooled cooler fixing structure according to still another exemplary embodiment of the present invention.

FIG. 9 is an exploded perspective view of a socket for testing a main board having a water-cooled cooler structure according to still another exemplary embodiment of the present invention. FIG. 10 is a perspective view of the socket for testing a main board having a water-cooled cooler fixing structure according to still another exemplary embodiment of the present invention.

FIGS. 9 and 10 illustrate a socket 100 for testing a main board having a water-cooled cooler fixing structure according to still another exemplary embodiment of the present invention. As illustrated in FIGS. 9 and 10, the socket 110 for testing a main board according to still another exemplary embodiment of the present invention does not have a separate socket fixing unit but has a socket body 110 whose lower end is in contact with the top of a CPU 12 to transfer heat generated by the CPU 12 to the socket body 110.

Meanwhile, as described above, the heat transferred to the socket body 110 in direct contact with the top of the CPU 12 is cooled not only by ambient air but also by a water-cooled cooler 50 inserted into and positioned in the cooler positioning recess 112 formed at an upper portion of the socket body 110 to be fixed to the socket body 110 through the cooler fixing unit and the cooler pressing unit. Here, the structures and functions of the cooler positioning recess 112, the cooler fixing unit, and the cooler pressing unit are the same as those of the socket 100 for testing a main board illustrated in FIGS. 1 to 4.

The present invention enables easy testing of the fraction defective of a main board by using a fixing socket for a test for easily attaching a water-cooled cooler to the top surface of a CPU, and a water-cooled cooler attached to the top surface of the CPU through the fixing socket when the fraction defective of the main board for a computer is tested.

The present invention also enables smooth testing of the fraction defective of a main board by easily attaching a water-cooled cooler to the top surface of a CPU in a form in which the main board is fixed by the socket or the socket is fixed to the main board.

The present invention also allows for an excellent attaching force between a CPU and a water-cooled cooler by resiliently attaching the water-cooled cooler to the top surface of the CPU in a form in which the main board is fixed by the socket or the socket is fixed to the main board, and enhances the accuracy of the test by efficiently cooling heat generated by the CPU.

It will be understood by those of ordinary skill in the art that various changes in form and details may be made therein without departing from the spirit and scope of the present invention as defined by the following claims.

What is claimed is:

1. A socket for testing a main board having a water-cooled cooler fixing structure, comprising:
   a socket body configured to be installed over a CPU mounted on a main board and having a cooler positioning recess for housing a water-cooled cooler;
   a cooler fixing unit having one end pivotally coupled to the socket body through a hinge and configured to fix the water-cooled cooler in the cooler positioning recess;
   a cooler pressing unit disposed at a bottom side of the cooler fixing unit and configured to resiliently press a top surface of the water-cooled cooler in the cooler positioning recess of the socket body thorough fixation of the cooler fixing unit; and
   a socket fixing unit configured to fix the socket body onto the main board wherein the cooler fixing unit includes: a hook member pivotally installed at the other end of the cooler fixing unit and having a catching hook at a bottom end of the hook member; a catching step formed at a predetermined region of the socket body corresponding to the catching hook of the hook member; and a resilient spring installed at the other end of the cooler fixing unit and configured to constantly apply a force in a direction of maintaining the catching hook to be caught by the catching step.

2. The socket of claim 1, wherein the hinge is inserted into a lengthwise hinge insertion hole having a predetermined depth and formed at the socket body to pivotally couple said one end of the cooler fixing unit to the socket body, and is fixed in the hinge insertion hole by a screw head of a hinge fixing screw.

3. The socket of claim 1, wherein the cooler pressing unit includes:
   a positioning recess formed on a lower bottom side of the cooler fixing unit and including hinge holes formed at both sides thereof;
   a cooler pressing piece having a size corresponding to the positioning recess and protruding from the positioning recess, wherein the cooler pressing piece includes hinge through-holes corresponding to the hinge holes so that the cooler pressing piece is moved upward and downward;
   a hinge passing through the hinge holes and the hinge through-holes to install the cooler pressing piece in the positioning recess; and
   a pressing spring installed in the positioning recess to constantly press the cooler pressing piece outward.

4. The socket of claim 3, wherein a position fixing recess corresponding to the cooler pressing piece of the cooler pressing unit is formed at a central portion of a top surface of the water-cooled cooler to fix the position of the water-cooled cooler by the cooler pressing piece when the water-cooled cooler is fixed to the cooler positioning recess through the cooler fixing unit.

5. The socket of claim 1, wherein the socket fixing unit includes:
   a plurality of screw coupling holes formed on a bottom surface of the socket body; and
   a plurality of fixing bolts passing through a bottom surface of the main board to fix the socket body to the main board by coupling to the screw coupling holes.

6. A main board testing socket having a water-cooled cooler fixing structure, comprising:
   a socket body configured to be installed over a CPU mounted on a main board and having a cooler positioning recess for housing a water-cooled cooler;
   a cooler fixing unit having one end pivotally coupled to the socket body through a hinge and configured to fasten the water-cooled cooler in the cooler positioning recess;
   a cooler pressing unit disposed at a bottom side of the cooler fixing unit and configured to resiliently press a top surface of the water-cooled cooler in the cooler positioning recess of the socket body thorough fixation of the cooler fixing unit; and
   a socket fixing unit configured to fix the socket body onto the main board,
   wherein the cooler fixing unit includes:
      a hook member pivotally installed at the other end of the cooler fixing unit and having a catching hook at a bottom end of the hook member;
      a catching step formed at the socket body corresponding to the catching hook of the hook member; and
      a resilient spring installed at the other end of the cooler fixing unit and configured to constantly apply a force in a direction of maintaining the catching hook to be caught by the catching step, and
   wherein the cooler pressing unit includes:
      a positioning recess formed on a bottom side of the cooler fixing unit and including hinge holes formed at both sides thereof;
      a cooler pressing piece having a size corresponding to the positioning recess, protruding from the positioning recess, and including hinge through-holes formed corresponding to the hinge holes so that the cooler pressing piece is moved upward and downward;
      a hinge passing through the hinge holes and the hinge through-holes to install the cooler pressing piece in the positioning recess; and
      a pressing spring installed in the positioning recess to constantly press the cooler pressing piece outward.

* * * * *